United States Patent [19]

Austin

[11] Patent Number: 5,707,244
[45] Date of Patent: Jan. 13, 1998

[54] STANDOFF GROUND CONNECTOR

[75] Inventor: Ronald Austin, Westchester, Ill.

[73] Assignee: Illinois Tool Works Inc., Glenview, Ill.

[21] Appl. No.: 675,686

[22] Filed: Jul. 3, 1996

[51] Int. Cl.[6] ........................................ H01R 4/66
[52] U.S. Cl. .............................. 439/95; 361/816; 24/453; 24/295
[58] Field of Search .................... 439/95–97, 92; 174/35 GC, 35 R; 361/816; 24/453, 295, 293

[56] References Cited

U.S. PATENT DOCUMENTS 5,138,529  8/1992  Colton et al. ....................... 439/95
5,267,125  11/1993  Liu ....................................... 439/95

FOREIGN PATENT DOCUMENTS 2266199  10/1993  United Kingdom ................ 439/96

*Primary Examiner*—Gary F. Paumen
*Attorney, Agent, or Firm*—Kane, Dalsimer, Sullivan, Kurucz, Levy, Eisele and Richard, LLP

[57] ABSTRACT

A standoff ground connector for mounting a circuit board to a chassis in a piece of electronic equipment in a standoff grounded position relative thereto includes a support platform onto which a circuit board may be mounted and two legs extending from the support platform for connection to the chassis. At least one pre-load form member having an apex extends between the legs. The apex, which protrudes beyond the support platform relative to the legs, is resiliently depressed toward the support platform when a circuit board is attached thereto. The depression of the apex causes the pre-load form member to bias the legs apart from one another, thereby strengthening the ground connection between the standoff ground connector and the chassis. The apex presses back on the circuit board, thereby strengthening the ground connection between the standoff ground connector and the circuit board, so that the circuit board is effectively grounded to the chassis.

9 Claims, 4 Drawing Sheets

5,707,244

STANDOFF GROUND CONNECTOR

BACKGROUND OF THE INVENTION

1. Field of The Invention

The present invention relates to electronic equipment, and specifically to personal computers. More particularly, the invention is a standoff ground connector for mounting a circuit board on the chassis within the cabinet of a personal computer.

2. Description of the Prior Art

Circuit boards in electronic equipment, such as personal computers, typically must be mounted on a chassis within the equipment and electrically grounded thereto. Often there is an additional requirement to mount the circuit board in a position separated from and parallel to the chassis. The mounting means used for this latter purpose are referred to as standoffs.

In the prior art, standoffs have generally comprised threaded members, such as screws or threaded rods, directed upward through the chassis and through unthreaded collars or sleeves. The circuit board, in turn, provided with mounting holes, are attached to the threaded members by nuts, and are separated from the chassis by a distance equal to the length of the collars or sleeves.

It will be clear to even the casual reader that several standoffs, amounting to a number of small individual parts, are required to mount a single circuit board. Accordingly, there is a need for a simple standoff connector to carry out the mounting of circuit boards in electronic equipment in standoff positions in a more elegant manner and with fewer parts. At the same time, the standoff connector must effectively and reliably ground the circuit board to the chassis. Both of these needs are met by the standoff ground connector of the present invention.

SUMMARY OF THE INVENTION

Accordingly, the present invention is a standoff ground connector for mounting a circuit board to a chassis in a piece of electronic equipment in a standoff grounded position relative thereto. The standoff ground connector comprises a support platform for the circuit board. The support platform has means for snappingly mounting the circuit board thereon. The mounting means may be a pair of prongs having outwardly curved surfaces. The prongs are inserted through a hole in the circuit board, which is then snapped down past the outwardly curved surfaces into a locked position.

A first leg and a second leg extend from the support platform in a direction opposite to that of the prongs. The legs include means for attaching the standoff ground connector fixedly to the chassis. The attaching means may be a foot on each of the two legs, and adjacent to the foot on each leg, but separated therefrom, a wedge-shaped locking member, whose base is closest to the foot and which is oriented on the leg in a direction toward the support platform.

The standoff ground connector includes at least one so-called pre-load form member extending between the first and second legs. The pre-load form member has an apex extending beyond the support platform relative to the first leg and the second leg. The apex is resiliently depressible toward and at least up to a point even with the support platform when a circuit board is mounted thereon.

When a circuit board is snappingly mounted to the support platform, the depressed apex of the pre-load form member biases the legs apart from one another to strengthen the electrical ground connection between the standoff ground connector and the chassis, and the apex of the pre-load form member presses back against the circuit board in a direction away from the legs to strengthen an electrical ground connection between the standoff ground connector and the circuit board, so that the circuit board is effectively grounded to the chassis.

The present invention will now be described in more complete detail with frequent reference being made to the figures identified below.

DETAILED DESCRIPTION OF THE PREFERRED EMBODIMENT

Figure 1:
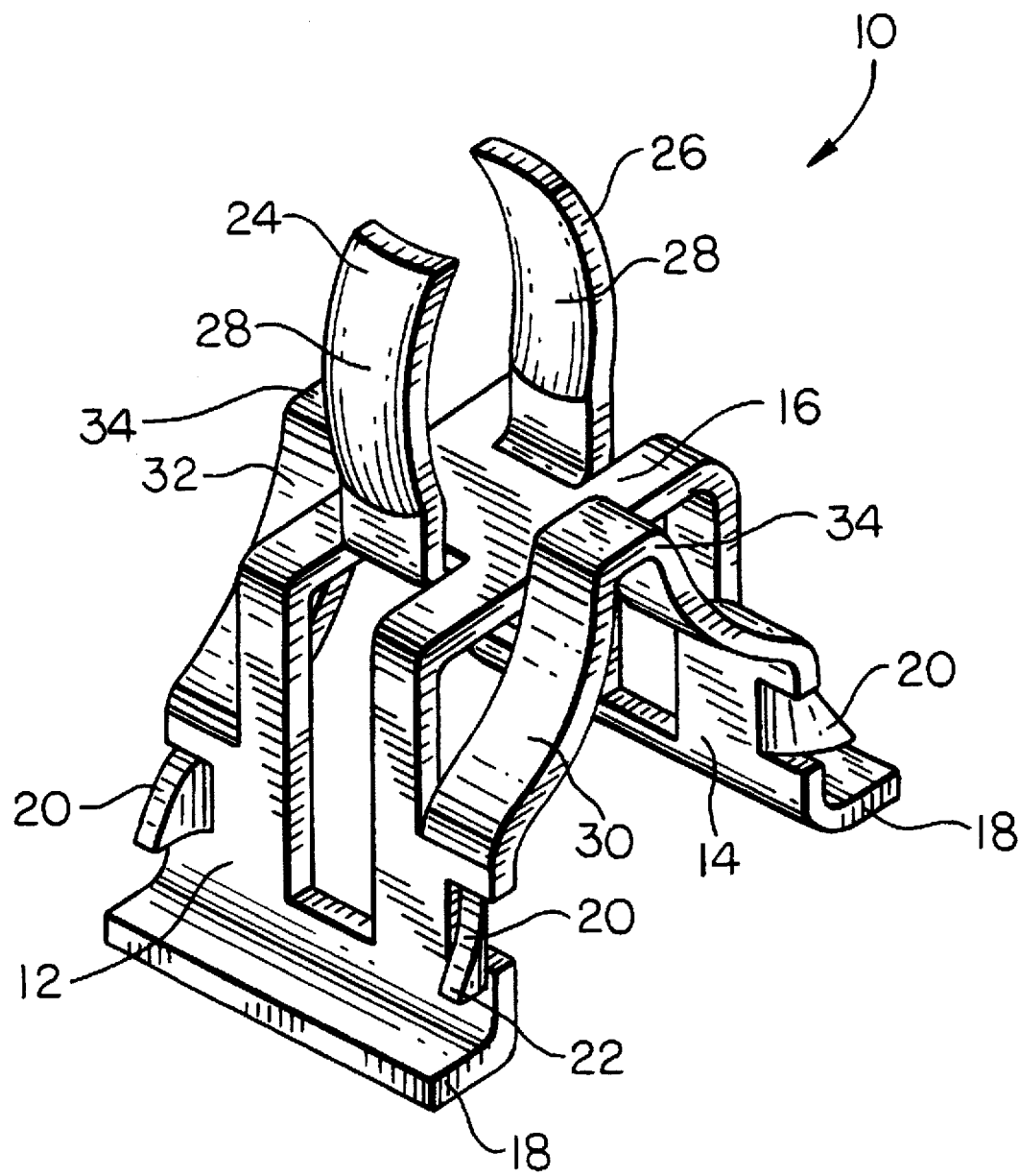
FIG. 1 is a perspective view of the standoff ground connector of the present invention.

Referring now to these figures, FIG. 1 is a perspective view of the standoff ground connector 10 of the present invention. The standoff ground connector 10 comprises a first leg 12 and a second leg 14 extending essentially parallel to one another from a support platform 16.

Each leg 12, 14 has a foot 18, and, spaced above foot 18, at least one, and preferably two, wedge-shaped locking members 20. Where two such locking members 20 are provided on a leg 12, 14, they are provided on opposite sides thereof. Wedge-shaped locking members 20 are oriented on their respective legs 12, 14 in a direction toward the support platform 16 with bases 22 closest to feet 18. Feet 18 are oriented away from one another in opposite directions.

Extending away from the support platform 16 in a direction opposite to that of the first and second legs 12, 14 are first and second prongs 24, 26, each of which has a curved surface portion 28 with a concave and a convex side. The concave sides of the curved surface portions 28 on the first and second prongs 24, 26 face one another, while the convex sides face away in the same directions as feet 18.

The standoff ground connector 10 also includes a first and a second pre-load form member 30, 32, each of which extends between the first and second legs 12, 14 on opposite sides of the support platform 16 and has an apex 34. Apexes 34 extend beyond support platform 16 relative to feet 18.

It will be clear to those who have studied the perspective view of the standoff ground connector 10 provided in FIG. 1 that the connector 10 may be integrally formed from a rectangular piece of metal sheet material by stamping, cutting and shaping it into the form it assumes in the figure. For example, the connector 10 may be fashioned from a rectangular piece of tin-plated stainless steel, although electrically conducting sheet material of any other type may be used so long as it can be worked into a shape like that shown in FIG. 1.

Figure 2:
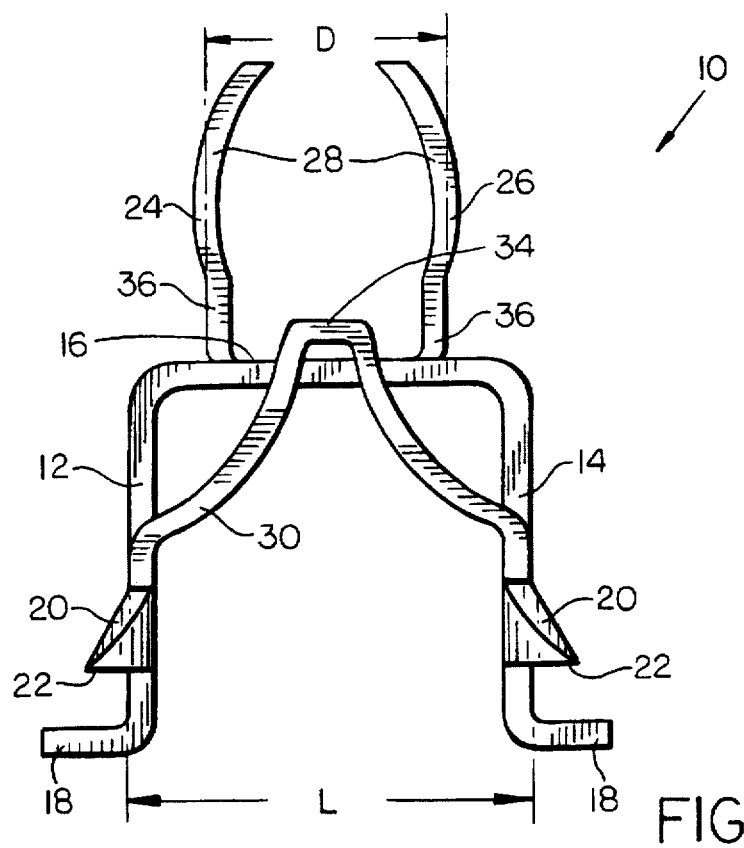
FIG. 2 is a side plan view of the connector.

FIG. 2 is a side plan view of the standoff ground connector 10, the opposite side being identical to the side shown. Pre-load form member 30, as noted above, has an apex 34 extending beyond support platform 16 relative to feet 18, as shown clearly in the figure. Further, wedge-shaped locking members 20 are spaced on legs 12, 14 from feet 18, and extend outward therefrom in the same directions as their respective feet 18. Bases 22 are closest to feet 18, while wedge-shaped locking members 20 themselves point along legs 12, 14 toward support platform 16. Finally, legs 12, 14 are substantially parallel to one another, and have outward facing surfaces separated from one another by length L. Further, first and second prongs 24, 26, in addition to curved surface portions 28, have straight parallel base portions 36 having outer surfaces separated from one another by distance D.

Figure 3:
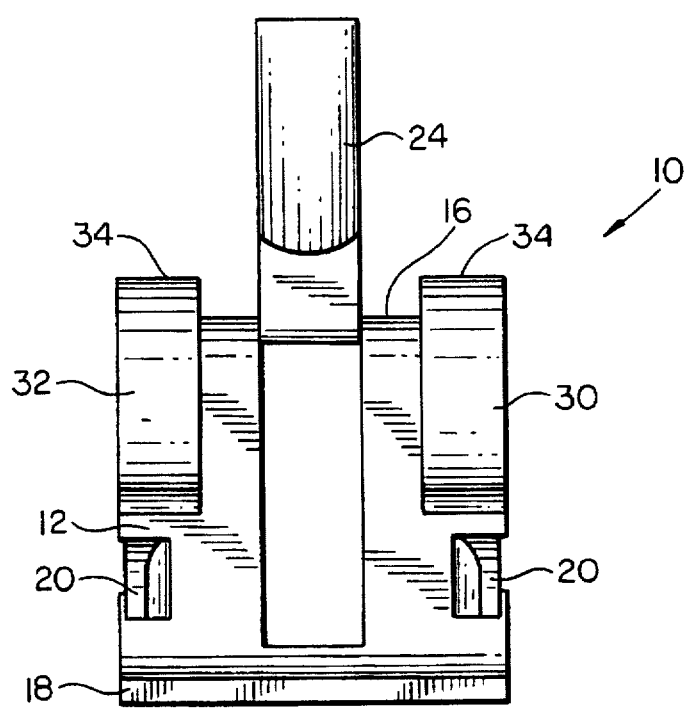
FIG. 3 is a front plan view thereof.

FIG. 3 is a front plan view of the standoff ground connector 10, the back side being identical to the front side. Apexes 34 are clearly more distant from foot 18 than support platform 16. First leg 12, as well as second leg 14, not shown in FIG. 3, are of width W.

Figure 4:
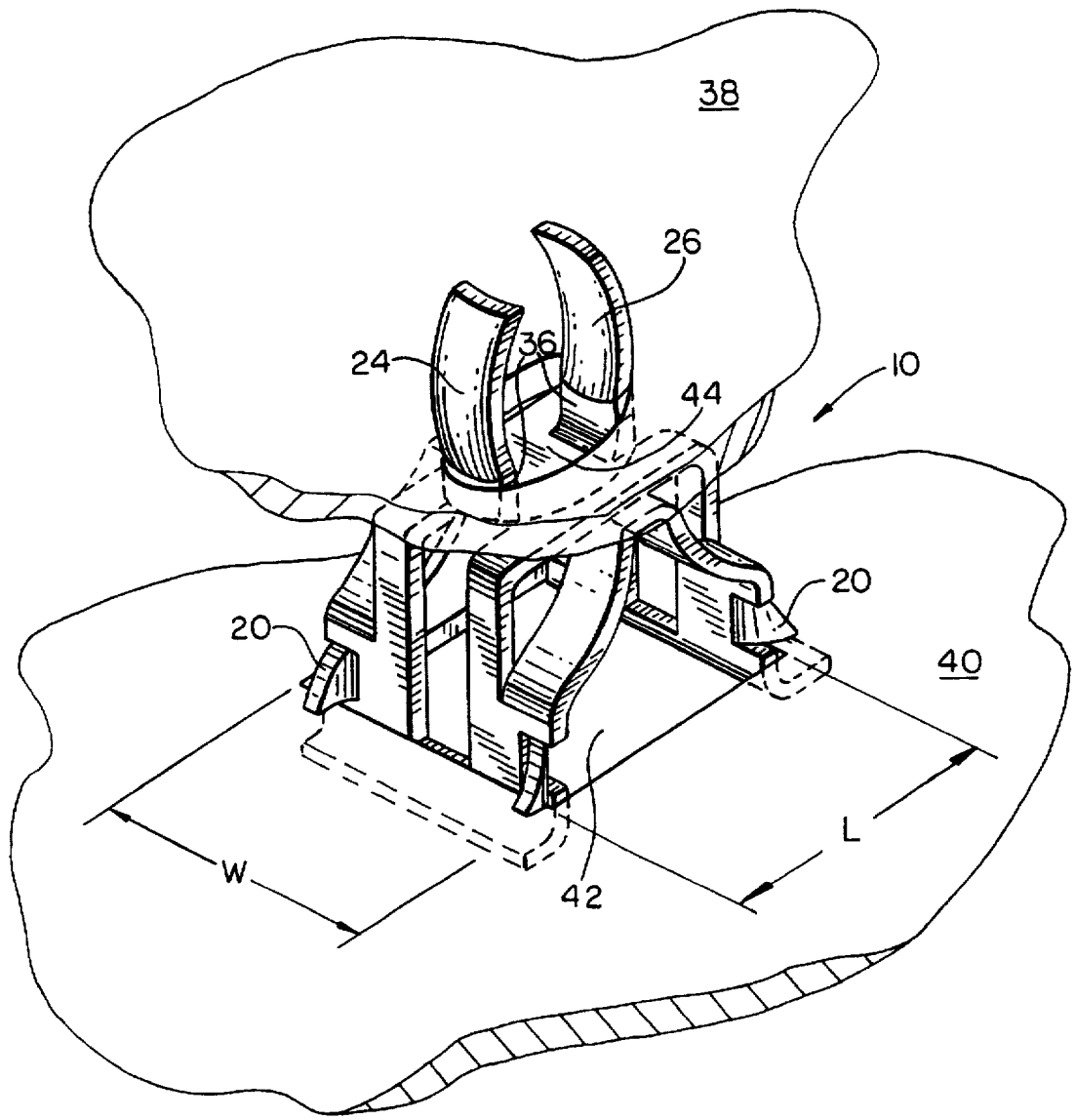
FIG. 4 is a perspective view of the connector in use in a piece of electronic equipment.

FIG. 4 is a perspective view of the standoff ground connector 10 as used to mount a circuit board 38 in a piece of electronic equipment, such as a personal computer, in a position separate from the chassis 40 thereof. Standoff ground connector 10 is secured to the chassis 40 by insertion upward through a rectangular hole 42 of dimensions L×W therein, these dimensions, of course, being the same as those identified above for connector 10. Most conveniently, hole 42 is square, so that L and W may be the same for both hole 42 and connector 10, whereby connector 10 may be inserted in any orientation in the hole 42. Connector 10 is inserted upward, prongs 24, 26 first, through chassis 40, and is locked into position when the bases 22 of wedge-shaped locking members 20 snap past chassis 40 securing it from further movement relative to chassis 40 between feet 18 and wedge-shaped locking members 20.

Circuit board 38, provided with a circular mounting hole 44 of diameter substantially equal to distance D, is snapped over prongs 24, 26 whose curved portions 28 hold it about base portions 36.

Figure 5:
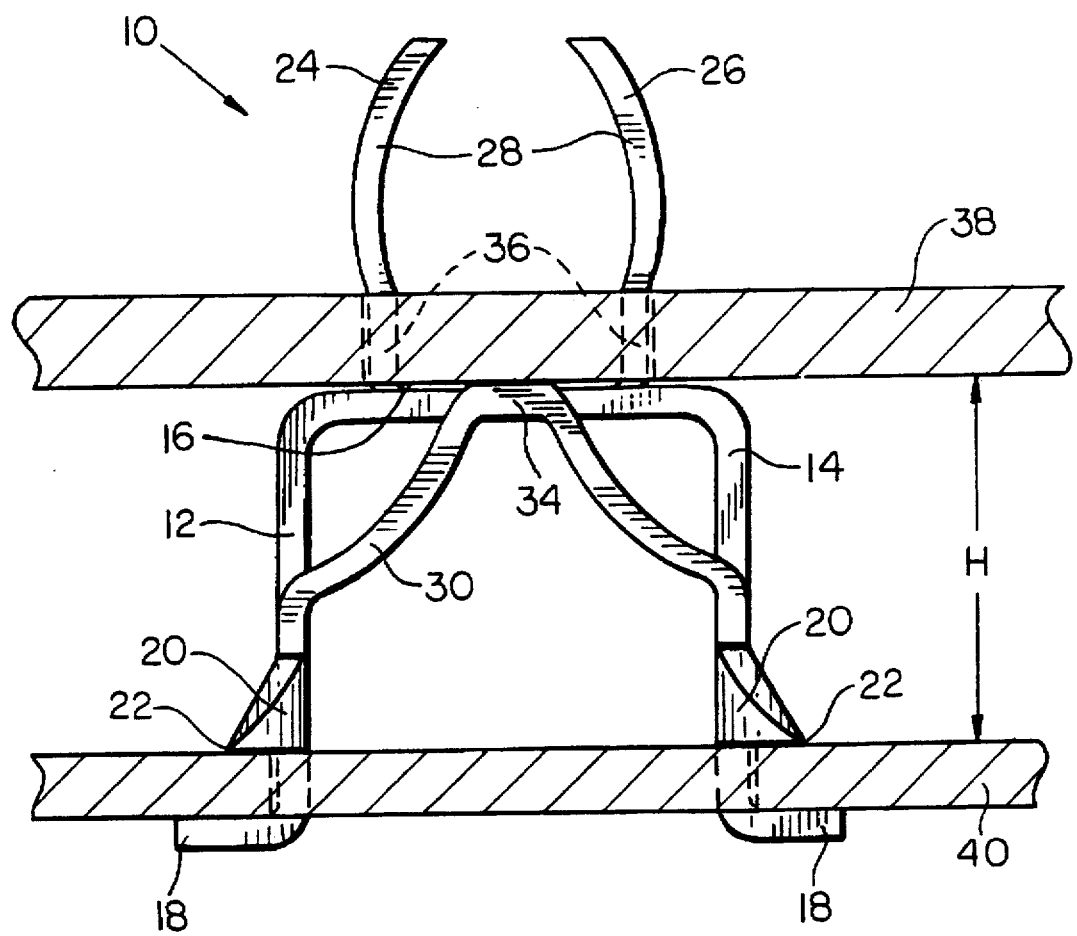
FIG. 5 is a side view of the connector as shown in FIG. 4.

FIG. 5 is a side view of the standoff ground connector 10 in the position of use shown in FIG. 4. The connector 10 is fixed to the chassis 40, viewed in cross section, by feet 18 and wedge-shaped locking members 20 on legs 12, 14, which prevent movement of the connector 10 relative to the chassis 40 once bases 22 of wedge-shaped locking members 20 have snapped through hole 42. Circuit board 38, also viewed in cross section, is held against support platform 16 and about base portions 36 by curved portions 28 of prongs 24, 26, and is also separated from chassis 40 by height H, measured between the support platform 16 and the bottoms (bases 22) of wedge-shaped locking members 20.

It will be noted that when the circuit board 38 is snapped into place atop standoff ground connector 10, pre-load form member 30 is forced downward until apex 34 is at substantially the same level as support platform 16. In this condition, the pre-load form members 30, 32 force legs 12, 14 outward apart from one another, ensuring good electrical contact between the connector 10 and the chassis 40. In addition, the upward force of apex 34 against the underside of circuit board 38 ensures good electrical contact between the connector 10 and the board 38, effectively grounding the board 38 to the chassis 40.

The present standoff ground connector 10 may be made in any size depending on the space requirements of the equipment in which it is to be used.

Modifications to the above would be obvious to those of ordinary skill in the art, but would not bring the invention so modified beyond the scope of the appended claims.

What is claimed is:

1. A standoff ground connector for mounting a circuit board to a chassis in a piece of electronic equipment in a standoff grounded position relative thereto, said standoff ground connector comprising:

a support platform for said circuit board;

means on said support platform for snappingly mounting a circuit board thereon;

a first leg and a second leg extending from said support platform;

means on said first and second legs for attaching said standoff ground connector fixedly to said chassis;

at least one pre-load form member extending between said first and second legs, said pre-load form member having an apex extending beyond said support platform relative to said first leg and said second leg, said apex being resiliently depressible toward and at least up to a point even with said support platform when a circuit board is mounted thereon;

whereby, when a circuit board is snappingly mounted to said support platform, said at least one pre-form load member biases said first leg and said second leg apart from one another to strengthen an electrical ground connection between said standoff ground connector and said chassis, and said apex of said at least one pre-load form member presses back against said circuit board in a direction away from said first leg and said second leg to strengthen an electrical ground connection between said standoff ground connector and said circuit board, so that said circuit board is effectively grounded to said chassis.

2. A standoff ground connector as claimed in claim 1 wherein said first leg and said second leg each have a first side and a second side, and wherein said at least one pre-load form member is a first and a second pre-load form member, said first pre-load form member extending between said first sides of said first and second legs, and said second pre-load form member extending between said second sides of said first and second legs.

3. A standoff ground connector as claimed in claim 1 wherein said means for snappingly mounting comprise a first prong and a second prong extending from said support platform in a direction opposite to that of said first and second legs.

4. A standoff ground connector as claimed in claim 3 wherein at least one of said first prong and said second prong has a curved surface portion having a concave side and a convex side, said concave side facing the other of said first prong and said second prong.

5. A standoff ground connector as claimed in claim 3 wherein said first prong and said second prong each have a curved surface portion having a concave side and a convex side, said concave sides of said first and second prongs facing one another.

6. A standoff ground connector as claimed in claim 1 wherein said means for attaching comprise a foot and a wedge-shaped locking member having a base on each of said first and second legs, said bases of said wedge-shaped locking members being adjacent to, but separated from, said feet on their respective legs, and said wedge-shaped locking members being oriented on said first and second legs in a direction toward said support platform.

7. A standoff ground connector as claimed in claim 1 wherein said first leg and said second leg each have a first side and a second side and wherein said means for attaching comprise a foot on each of said first and second legs, and a wedge-shaped locking member having a base on each side of each of said first and second legs, said bases of said wedge-shaped locking members being adjacent to, but separated from, said foot on each of said first and second legs, and said wedge-shaped locking members being oriented on said first and second legs in a direction toward said support platform.

8. A standoff ground connector as claimed in claim 1 integrally formed from a rectangular piece of metal sheet material.

9. A standoff ground connector as claimed in claim 8 wherein said metal sheet material is tin-plated stainless steel.

* * * * *